(12) United States Patent
Cho et al.

(10) Patent No.: US 6,941,647 B2
(45) Date of Patent: Sep. 13, 2005

(54) TRANSFER FOR TRAY FEEDER

(75) Inventors: Jae Hyuk Cho, Kyungki-do (KR); Sang Won Lee, Kyungki-do (KR); Dong Suh Lee, Seoul (KR)

(73) Assignee: Mirae Corporation, Choongchungnam-Do (KR)

( * ) Notice: Subject to any disclaimer, the term of this patent is extended or adjusted under 35 U.S.C. 154(b) by 383 days.

(21) Appl. No.: 10/061,391

(22) Filed: Feb. 4, 2002

(65) Prior Publication Data

US 2002/0194727 A1 Dec. 26, 2002

(30) Foreign Application Priority Data

Jun. 22, 2001 (KR) ......................................... 2001-35775

(51) Int. Cl.$^7$ ............................................... B23P 19/00
(52) U.S. Cl. ............................. 29/760; 29/759; 29/740; 29/720; 198/347.3; 414/752.1
(58) Field of Search ........................... 29/760, 739–743, 29/759, 832, DIG. 44; 414/416.01, 416.06, 752.1, 225.01, 793.8; 901/47; 198/349.6, 465.1, 347.1, 347.3

(56) References Cited

U.S. PATENT DOCUMENTS

| 4,166,316 | A | * | 9/1979 | Misawa et al. | 29/845 |
| 5,937,513 | A | * | 8/1999 | Inutsuka et al. | 29/832 |
| 6,266,873 | B1 | | 7/2001 | Kitamura et al. | 29/832 |
| 6,374,484 | B1 | * | 4/2002 | Yoshida et al. | 29/740 |
| 6,526,651 | B1 | * | 3/2003 | Hwang | 29/740 |
| 6,550,133 | B1 | * | 4/2003 | Seo et al. | 29/741 |
| 6,688,454 | B2 | * | 2/2004 | Cho et al. | 198/347.3 |

* cited by examiner

Primary Examiner—Minh Trinh
(74) Attorney, Agent, or Firm—Fleshner & Kim LLP

(57) ABSTRACT

The present invention discloses a transfer for a tray feeder comprising: a base frame; a support frame installed at both sides of the base frame; first and second linear motion guiders installed oppositely and longitudinally to the inside of the support frame and having a plurality of first and second linear motion guide rails; first and second plates installed to an upper portion of the first and second linear guides and having a cylinder block capable of supporting a side of the tray received an electronic parts and the like; and a driving unit installed to a side portion of the support frame and for making the movement of the first and second plates; wherein the first and second plates can move along the first and second guide rails, crossing with each other.

6 Claims, 8 Drawing Sheets

Mounter side

TRANSFER FOR TRAY FEEDER

BACKGROUND OF THE INVENTION

1. Field of the Invention

The present invention relates to a transfer for a tray feeder, and in particular to an improved transfer for a tray feeder which can continuously supply a tray plate on which an electronic parts is mounted to a mounter.

2. Description of the Background Art

Figure 1:
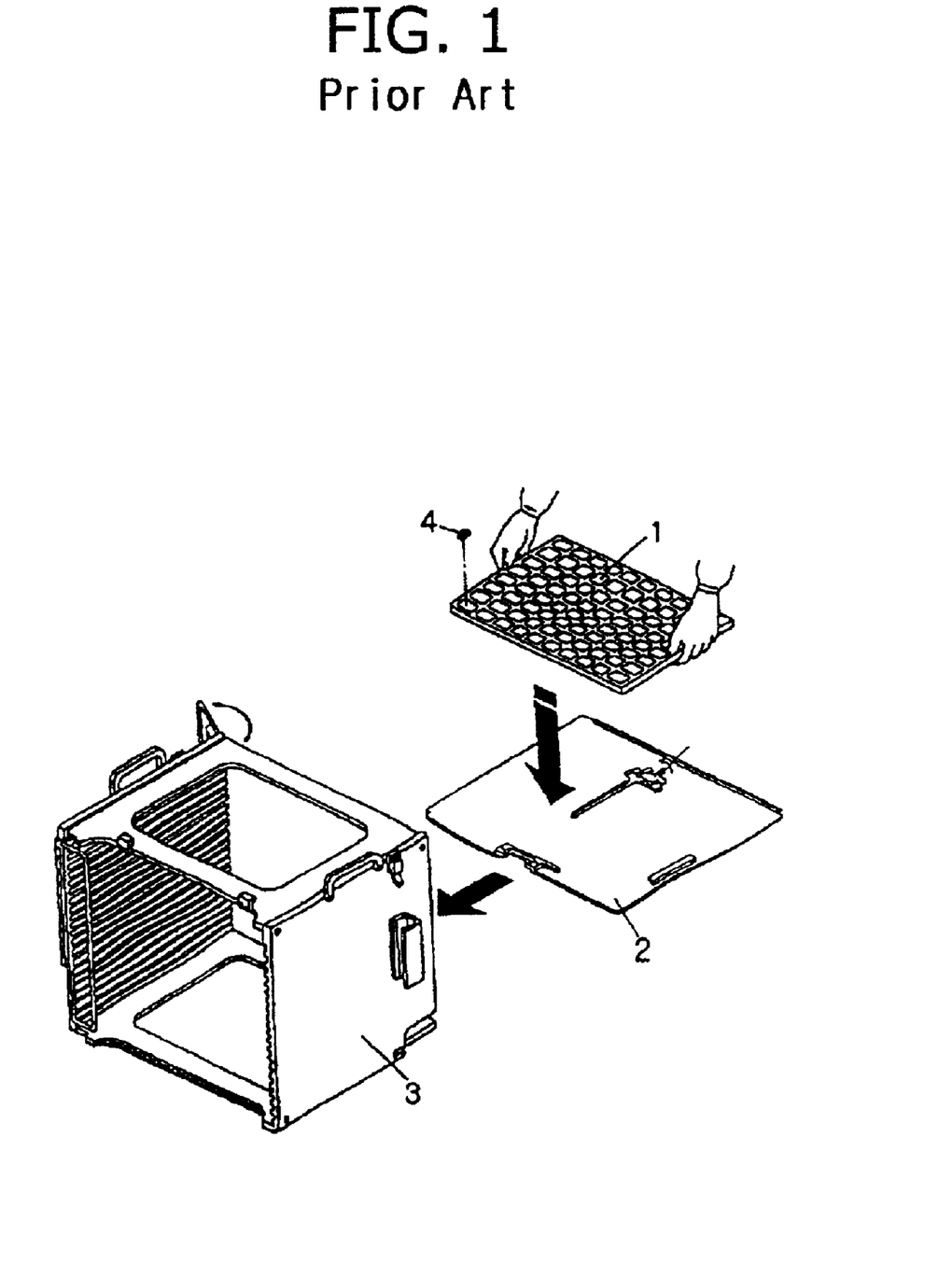
FIG. 1 is a perspective view illustrating a means for putting a tray in a magazine which is adapted to a conventional electronic parts feeder.
Figure 2:
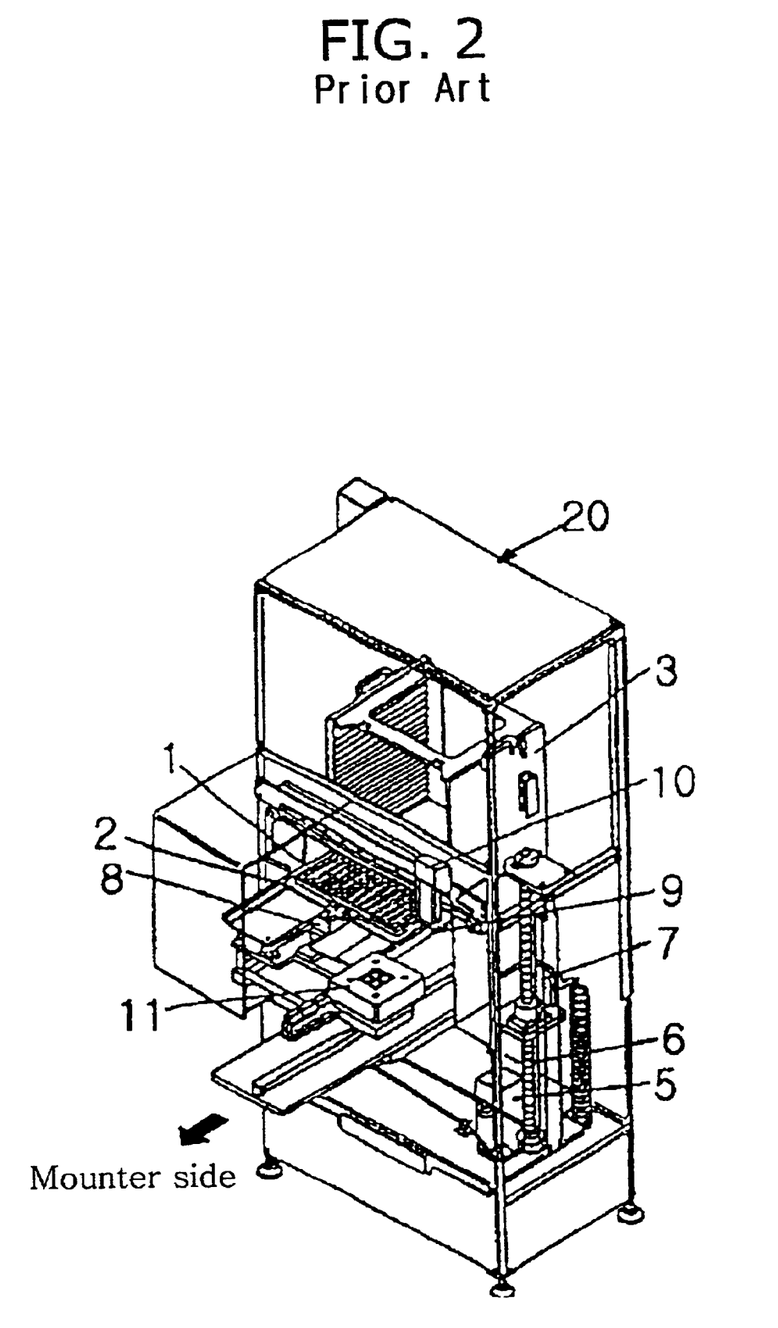
FIG. 2 is a perspective view illustrating the conventional electronic parts feeder.

Referring to FIGS. 1 and 2, in a conventional electronic parts feeder for feeding an electronic parts along a tray, a magazine 3 receiving the electronic parts 4 is supported by a lifter 7 lifted or lowered along a ball screw 6 driven by a driving motor 5, when a necessary electronic parts 4 is selected, the lifter 7 is moved in an upper or lower direction. The magazine 3 receiving a tray plate 2 is supported on the lifter 7. After a position of the lifter 7 is decided, the tray plate 2 is transferred by driving of a tray plate fetch unit 8.

Thereafter, the electronic parts 4 is moved to the upper portion of a centering table 11 by a moving unit 10 having a moving nozzle 9. The centering table 11 on which the electronic parts is put is moved to a side of the mounter, thereby supplying the electronic parts 4.

However, the conventional electronic parts feeder has a disadvantage in that the lifter 7 is always lifted or lowered in the operation of the mounter, and thus the electronic parts is not supplied during the operation of the mounter.

In addition, the electronic parts cannot be replaced during the operation of the mounter. Accordingly, while the tray plate on which the electronic parts is mounted is exchanged, the mounter should stop the operation. As a result, a mounting time of the electronic parts is increased, thereby reducing productivity.

SUMMARY OF THE INVENTION

Accordingly, it is an object of the present invention to provide a transfer for a tray feeder which can continuously supply a tray receiving an electronic parts to an electronic parts mounter, by intersecting and moving one of a plurality of plates along a cam curve unit.

In order to achieve the above-described object of the invention, in a transfer for a tray feeder providing an electronic parts to a surface mounter, the transfer for the tray feeder comprises a base frame; a support frame installed at both sides of the base frame; first and second linear motion guiders installed oppositely and longitudinally to the inside of the support frame and having a plurality of first and second linear motion guide rails; first and second plates installed to an upper portion of the first and second linear guides and having a cylinder block capable of supporting a side of the tray received an electronic parts and the like; and a driving unit installed to a side portion of the support frame and for making the movement of the first and second plates; wherein the first and second plates can move along the first and second guide rails, crossing with each other.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A transfer for a tray feeder in accordance with a preferred embodiment of the present invention will now be described in detail with reference to FIGS. 3 to 5.

The tray feeder (referred to as 'electronic parts feeder') of the present invention includes: a transfer 100 for transferring a plurality of tray plates; a stacker 200; a magazine 300 and an exchanger 400.

A pair of support frames 110a are installed at both sides of the transfer 100, and first and second plates 130 and 140 for transferring the tray plates 150 are positioned on the support frames 110a. A driving unit 120 is formed at one side portion of the support frame 110a, thereby moving the first and second plates 130 and 140.

Cylinder blocks 132 and 142 are positioned at one end portions of the first plate 130 and the second plate 140. A plurality of sensors 134a, 134b, 144a and 144b for sensing a tray 160 are installed at both side portions of the cylinder blocks 132 and 142. Edge protrusion units 136 and 146 for closely supporting the tray 160 are positioned at the front portions thereof.

The stacker 200 includes a cover frame 210 and a main frame 220. The cover frame 210 has a plurality of horizontal frames 211, longitudinal frames 212 and vertical frames 213 to surround an outer portion thereof. A base unit 216 is mounted at the lower portion of the vertical frames 213.

Figure 3:
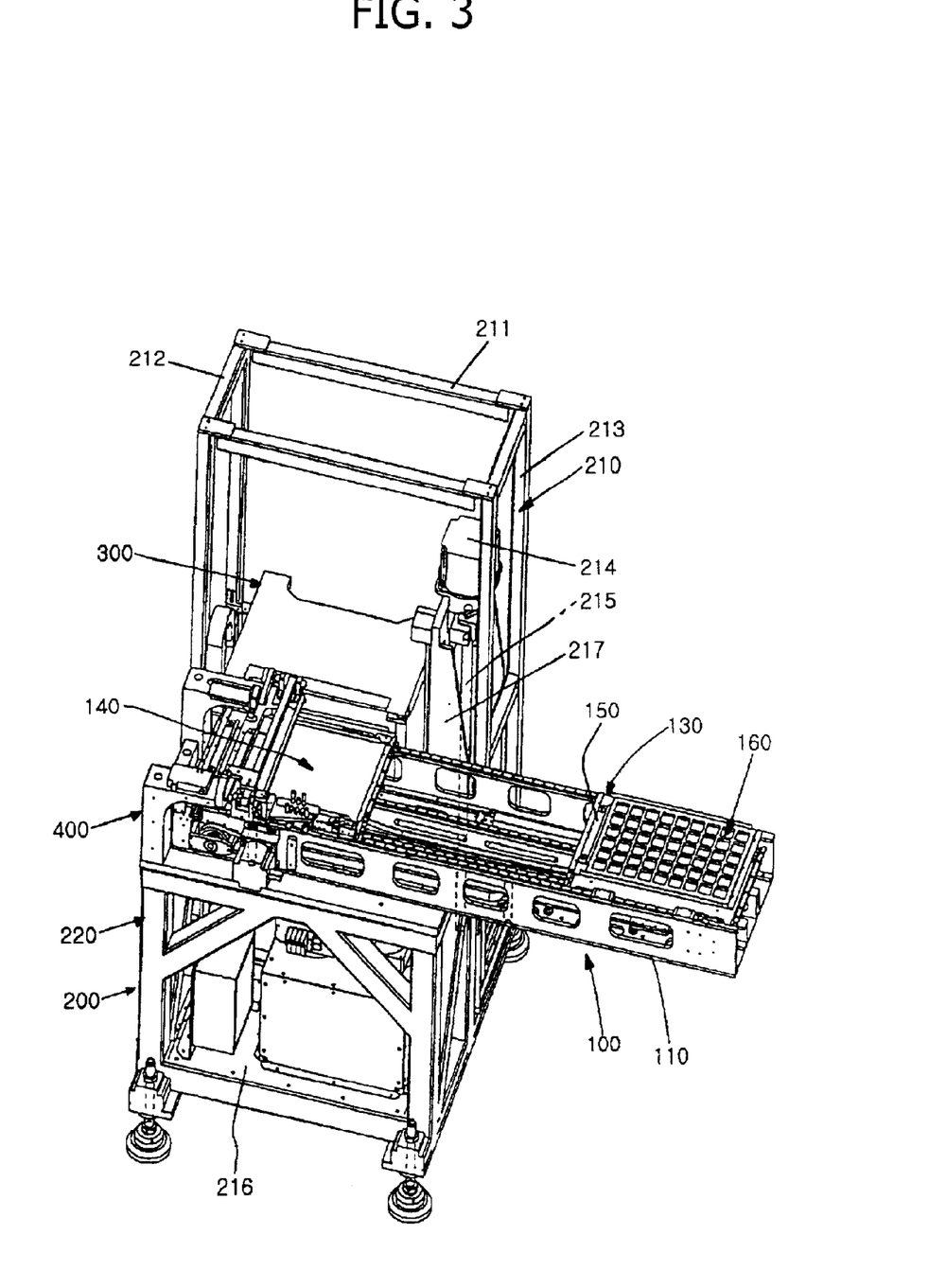
FIG. 3 is a perspective view illustrating a stacker unit having a transfer in accordance with the present invention.
Figure 4:
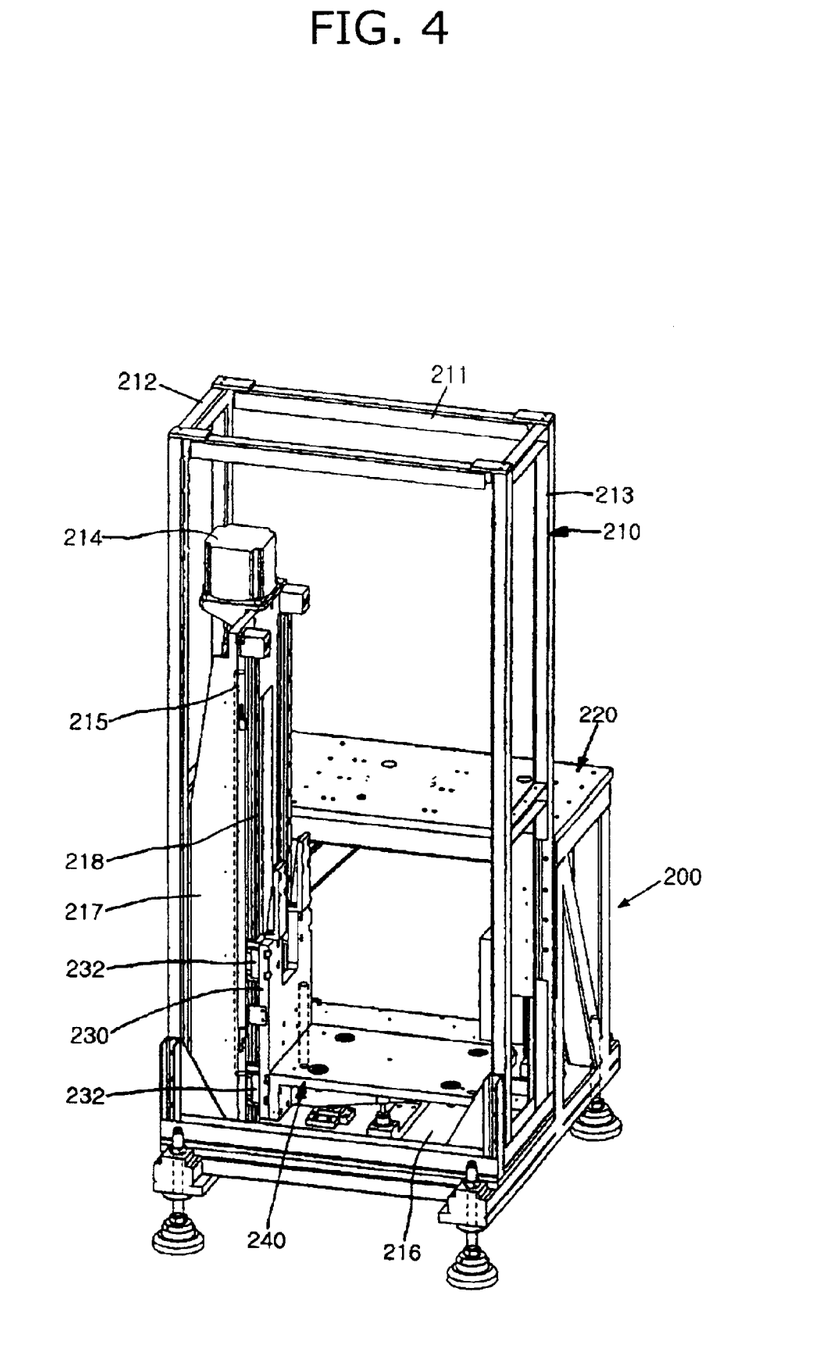
FIG. 4 is a perspective view illustrating a stacker unit which does not have the transfer.

As illustrated in FIGS. 3 and 4, the transfer 100 and the exchanger 400 are connected at the upper portion of the main frame 220 mounted at one side portion of the cover frame 210.

A driving motor 214 is installed at one upper side portion of a support frame 217 installed at one side portion of the main frame 220. A ball screw 215 is connected to a motor shaft (not shown) of the driving motor 214. Since the ball screw 215 is connected to one side portion of an elevator 240, when the ball screw 215 is operated by driving the driving motor 214, the elevator 240 is moved in a predetermined direction.

In addition, a plurality of LM guides 218 for guiding the elevator 240 positioned at an upper side of the base unit 216 are installed at one side portion of the support frame 217.

A plurality of guide blocks 232 connected to one side portion of the elevator 240 are inserted into the plurality of LM guides 218. The other portions of the guide blocks 232 are connected to one side portion of the guide frame 230 connected to the elevator 240, thereby capable of lifting or lowering the elevator 240.

A plurality of electronic parts (refer to FIG. 1) are mounted on the plurality of trays 160 in the magazine 300. The plurality of trays 160 are mounted on the plurality of tray plates 150.

The exchanger 400 is installed at one side portion of the transfer 100. The exchanger 400 puts or fetches the tray plate 150 in/from the magazine 300.

Figure 5:
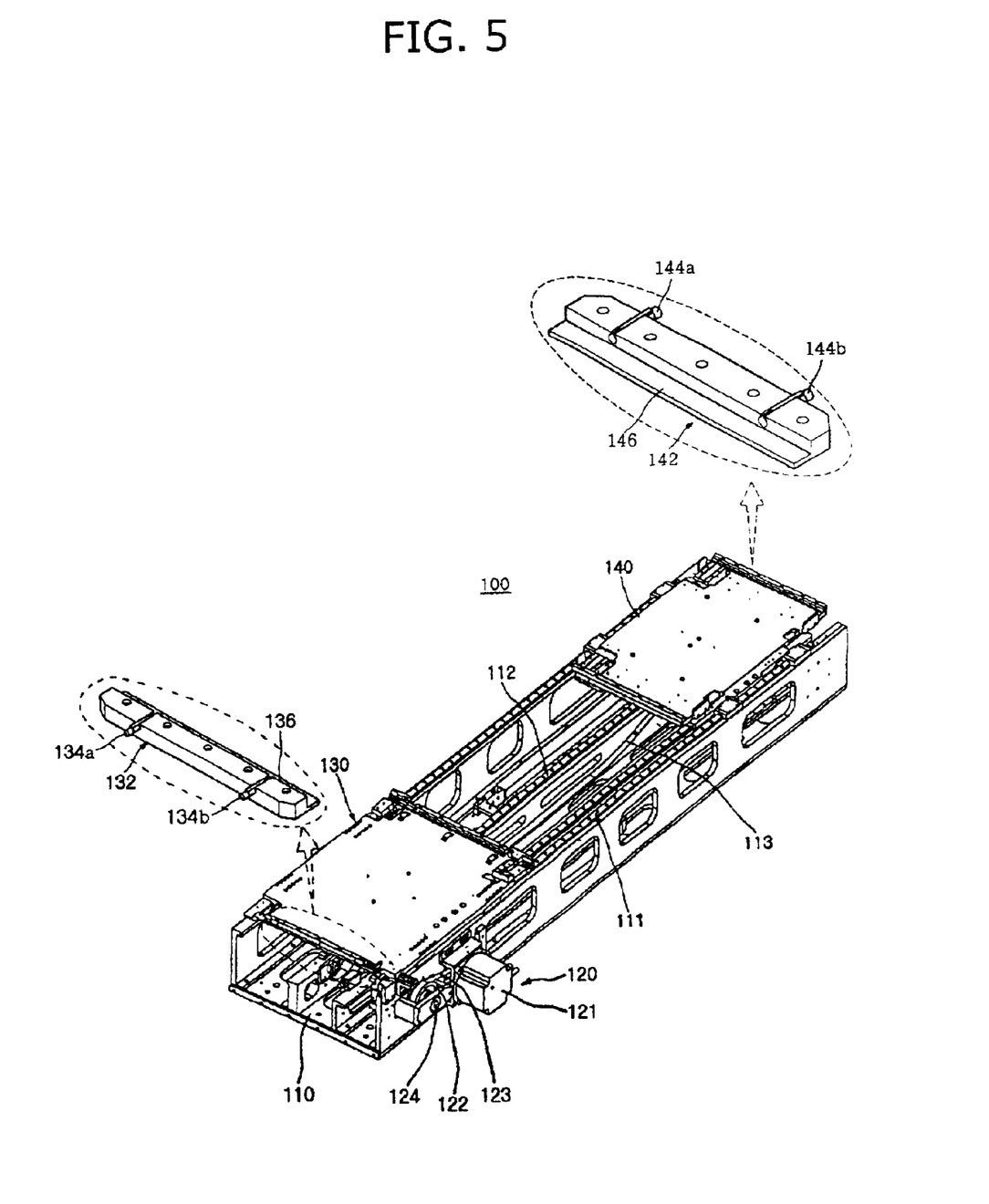
FIG. 5 is a perspective view illustrating the transfer before the operation.
Figure 6:
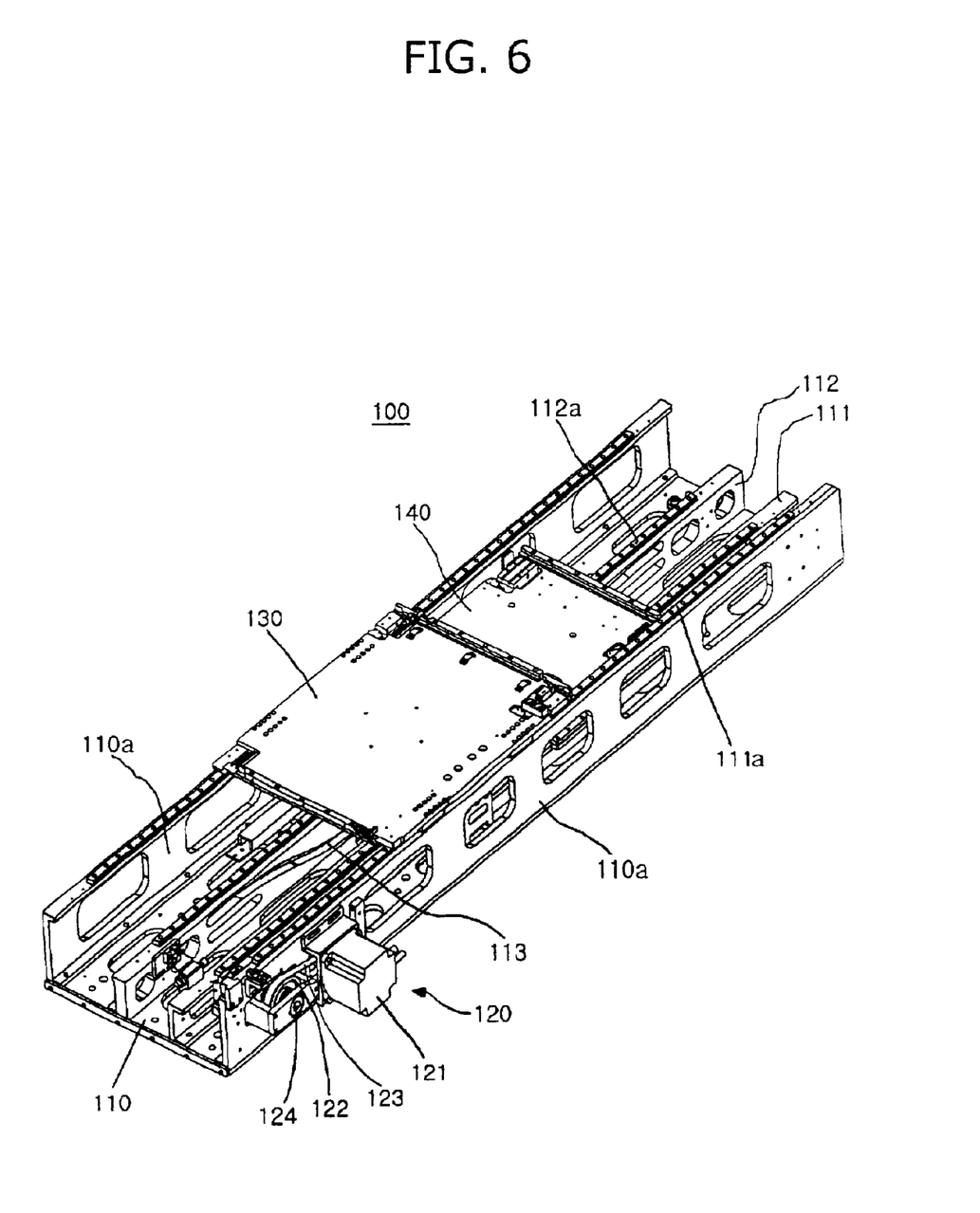
FIG. 6 is a perspective view illustrating the transfer during the operation.

FIG. 5 is a perspective view illustrating the transfer of FIG. 3 before the operation, and FIG. 6 is a perspective view illustrating the transfer during the operation.

The transfer 100 includes: a base frame 110; the first and second tray plates 130 and 140 where the tray plates 150 are mounted and supported; first and second LM guides 111 and 112 for guiding the first and second plates 130 and 140; and the driving unit 120 for driving the first and second plates 130 and 140.

The plurality of first and second LM guides 111 and 112 are positioned at an upper portion of the base frame 110, having a predetermined interval in a vertical direction.

First and second LM guide rails 111a and 112a are formed at an upper portion of the first and second LM guides 111 and 112.

Figure 7:
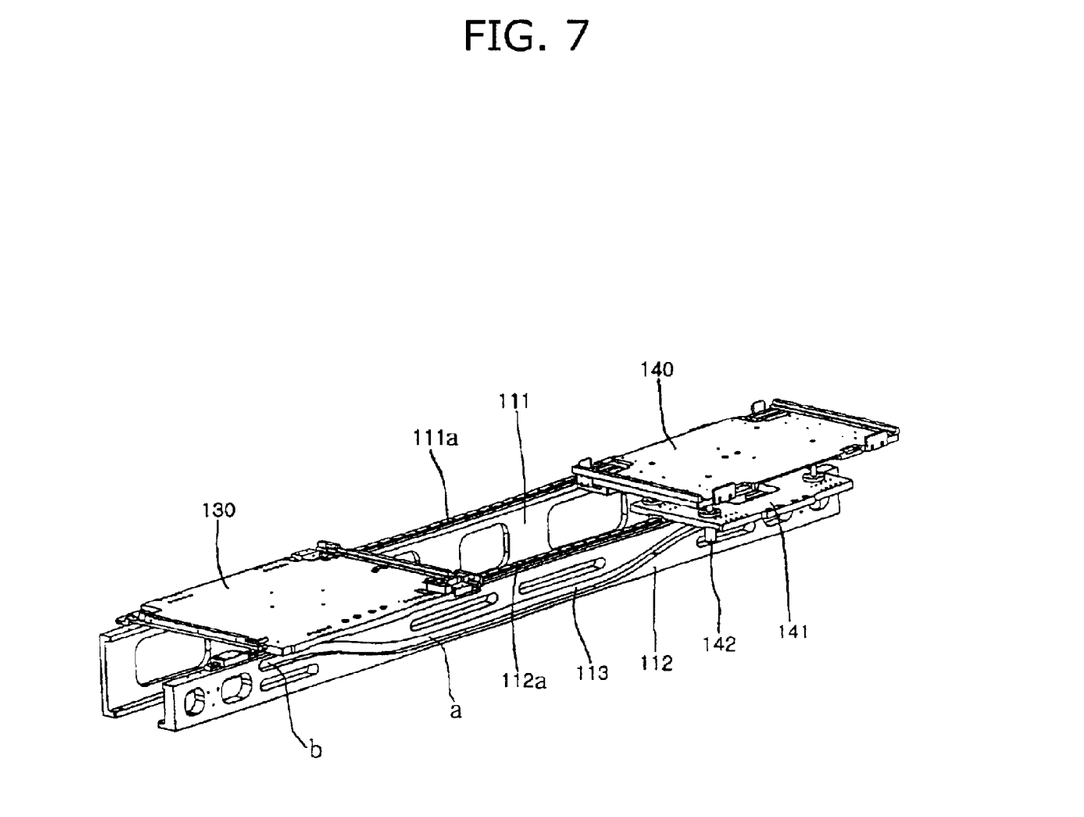
FIG. 7 is a perspective view illustrating first and second plates and first and second LM guides.

A cam curve unit 113 having a long oblong hole in a longitudinal direction is formed at the side portion of the second LM guide 112. As shown in FIG. 7, a center portion (a) of the cam curve unit 113 is formed lower than both end portions (b) thereof, thereby preventing collision in movement of the first and second plates 130 and 140.

The first plate 130 is movably formed on the first LM guide rail 111a, and the second plate 140 is movably formed on the second LM guide rail 112a. The driving unit 120 is installed at one side portion of the base frame 110.

The driving unit 120 includes a driving pulley (not shown) having a driving motor 121 and a belt 123, and an idle pulley 122 inserted into and supported by a pulley shaft 124. The idle pulley 122 is installed on a rotation shaft 124 connected to the first and second plates 130 and 140. The belt 123 is positioned in one driving pulley and the idle pulley 122.

Figure 8:
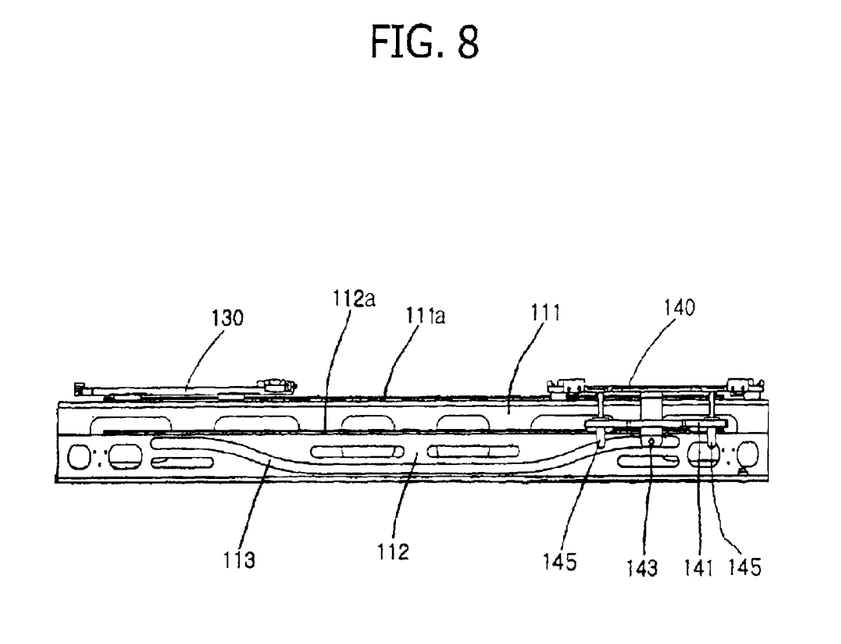
FIG. 8 is a side view illustrating the transfer before the operation.
Figure 9:
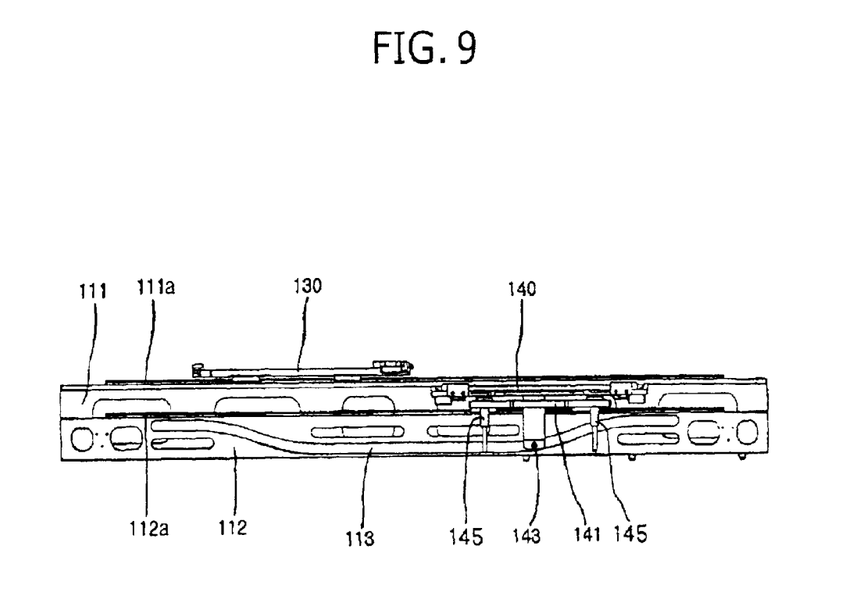
FIG. 9 is a side view illustrating the transfer during the operation.

As depicted in FIGS. 7 to 9, a guide plate 141 is installed at the lower portion of the second plate 140.

A plurality of ball bushes 145 are formed at both side portions of the lower portion of the guide plate 141, having a predetermined interval. A roller 143 is formed between the ball bushes 145. The roller 143 is inserted into the cam curve unit 113 passing through the side portion of the second LM guide 112.

The operation of the transfer for the tray feeder in accordance with the present invention will now be explained.

When the tray plate 150 on which the tray 160 having the electronic parts fed from the electronic parts feeder is mounted is received in the magazine 300, and the driving motor 214 installed at one side portion of the support frame 217 of the stacker 200 is driven, the elevator 240 is lifted along the LM guide 218 formed at one side portion of the support frame 217 by rotation of the ball screw 215 connected to the motor shaft of the driving motor 214.

When the elevator 240 is lifted and stops at a predetermined position, the nozzle unit (not shown) of the exchanger 400 advances to the magazine 300 to fetch the tray plate 150 received in the magazine 300 mounted on the elevator 240.

Here, the first plate 130 is moved to one side portion of the exchanger 400 by the driving of the driving unit 120 positioned at one side portion of the first LM guide of the transfer 100, and stands by for a mounting operation of the tray plate 10.

When the advanced nozzle unit of the exchanger 400 adsorbs and seizes the tray plate 150, and fetches the tray plate 150 by backward driving, the tray plate 150 is positioned on the first plate 130 formed at the upper portion of the transfer 100 by removal of a suction force of the nozzle unit of the exchanger 400.

When the tray 160 is positioned on the tray plate 150, the plurality of sensors 134a and 134b of the cylinder block 132 installed at one side portion of the first plate 130 sense a position of the tray 160. Accordingly, one side portion of the tray 160 is supported by the edge protrusion unit 136 formed on the cylinder block 132, to firmly position the tray 160.

The cylinder block 132 of the first plate 130 has the same constitution and operation as the cylinder block 142 of the second plate 142.

On the other hand, when the driving motor 121 of the driving unit 120 is driven, the driving pulley (not shown) is driven to rotate the belt 123 and the idle pulley 122. Thus, the rotation shaft 124 inserted into and supported by the idle pulley 122 is rotated, and the belt 123 is rotated, thereby driving the first and second plates 130 and 140.

When the first plate 130 is moved from the electronic parts feeder to the electronic parts mounter, having the tray plate 150 receiving the electronic parts mounted thereon, the second plate 140 is moved to the exchanger side to take another tray plate 150 receiving the electronic parts.

On the other hand, the guide plate 141 is formed at the lower portion of the second plate 140 moved along the second LM guide 112. The plurality of ball bushes 145 and the rollers 143 positioned at both end portions of the lower portion of the guide plate 141 are inserted into the cam curve unit 113 passing through the side portion of the second LM guide 112. Therefore, the second plate 140 is moved along the cam curve 113 by guiding of the ball bushes 145 and sliding of the rollers 143. The second plate 140 is lifted in a predetermined section of both end portions of the second LM guide 112, and lowered in a predetermined section of the center portion thereof, thereby performing straight and curved line movements along the second LM guide 112.

When the second plate 140 performs the straight line movement along the second LM guide 112, it is moved below the first plate 130 performing the curved line movement by the cam curve unit 113. Accordingly, the first and second plates 130 and 140 are moved without collision. The second plate 140 is moved to the exchanger side, and the nozzle unit of the exchanger 400 adsorbs and seizes the tray plate 150 finishing the mounting operation of the electronic parts, puts the tray plate 150 in the magazine 300 by forward driving, removes the suction force, and moves in a backward direction.

When the elevator 240 is lifted by a predetermined distance and stops at a predetermined position, the nozzle unit of the exchanger 400 advances, adsorbs and seizes the tray plate 150 on which the electronic parts is mounted, moved in a backward direction, and positioned on the second plate 140. When the nozzle unit removes the suction force, the tray plate 150 is stably positioned.

When the plurality of tray plates 150 of the magazine 300 are all fetched, and when the plurality of tray plates 150 finishing the mounting operation of the electronic parts are all put in, the elevator 240 is lowered to replace the plurality of tray plates 150 finishing the mounting operation of the electronic parts by the plurality of tray plates 150 on which the electronic parts are mounted.

That is, the plates 130 and 140 formed on the transfer 100 exchange their positions without collision. Accordingly, it is possible to pick up the electronic parts mounted on the tray 160, without stopping the system to replace the tray 160. As a result, the electronic parts feeder can be continuously operated.

As discussed earlier, in accordance with the present invention, when the tray on which the electronic parts is mounted is transferred by using the transfer and the parts is mounted on the parts mounter, one plate keeps the tray having the electronic parts in a standby state, and another plate mounts the electronic parts on the electronic parts feeder, thereby consecutively performing the mounting operation of the electronic parts.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A transfer for a tray feeder providing electronic parts to a surface mounter, the transfer for the tray feeder, comprising:

a base frame;

a support frame installed at both sides of the base frame;

first and second linear motion guides installed oppositely and longitudinally to the inside of the support frame and having a plurality of first and second linear motion guide rails;

first and second plates installed to an upper portion of the first and second linear guides and having a cylinder block capable of supporting a side of a tray holding electronic parts; and a driving unit installed to a side portion of the support frame and configured to move the first and second plates, wherein the first and second plates move along the first and second guide rails, crossing with each other.

2. The transfer of claim 1, wherein a cam curve unit is formed at a predetermined portion of the second linear motion guide and a center portion of the cam curve unit is formed lower than both end portions thereof.

3. The transfer of claim 1, wherein the second plate comprises a plurality of rollers which moves along a cam curve unit of the second linear guide.

4. The transfer of claim 1, wherein each cylinder block of the first and second plates comprises a plurality of sensors capable of sensing a position of the tray and a plurality of edge protrusion units capable of supporting and fixing the tray.

5. The transfer of claim 1, wherein the driving unit includes a driving pulley having a driving motor and a belt, and an idle pulley inserted into and supported by a pulley shaft and the idle pulley is installed on a rotation shaft connected to the first and second plates and the belt is positioned in the driving pulley and the idle pulley.

6. The transfer of claim 3, further comprising a guide plate mounted below the second plate and configured to move along the second linear motion guide, wherein a plurality of bushings are mounted in the support plate, and wherein shafts attached to the second plate pass through corresponding ones of the bushings to guide upward and downward movement of the second plate.

* * * * *

UNITED STATES PATENT AND TRADEMARK OFFICE
CERTIFICATE OF CORRECTION

PATENT NO. : 6,941,647 B2 Page 1 of 1
APPLICATION NO. : 10/061391
DATED : September 13, 2005
INVENTOR(S) : Cho et al.

It is certified that error appears in the above-identified patent and that said Letters Patent is hereby corrected as shown below:

On the cover page, item

[*] Notice: Subject to any disclaimer, the term of this patent is extended or adjusted under 35 USC 154(b) by (383) days Delete the phrase "by 383" and insert -- by 495 days--

Signed and Sealed this

Twenty-second Day of May, 2007

JON W. DUDAS
*Director of the United States Patent and Trademark Office*